(12) United States Patent
Suzuki

(10) Patent No.: US 9,509,413 B2
(45) Date of Patent: Nov. 29, 2016

(54) OPTICAL RECEIVER, OPTICAL RECEIVING DEVICE, AND METHOD FOR CORRECTING RECEIVED OPTICAL INTENSITY

(71) Applicant: NEC Corporation, Minato-ku, Tokyo (JP)

(72) Inventor: Yasuyuki Suzuki, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 14/439,108

(22) PCT Filed: Oct. 30, 2013

(86) PCT No.: PCT/JP2013/006435
§ 371 (c)(1),
(2) Date: Apr. 28, 2015

(87) PCT Pub. No.: WO2014/068978
PCT Pub. Date: May 8, 2014

(65) Prior Publication Data
US 2015/0295660 A1 Oct. 15, 2015

(30) Foreign Application Priority Data
Nov. 1, 2012 (JP) ................. 2012-241996

(51) Int. Cl.
*H04B 10/06* (2006.01)
*H04B 10/61* (2013.01)
(Continued)

(52) U.S. Cl.
CPC ............. *H04B 10/616* (2013.01); *H03F 3/08* (2013.01); *H03F 3/45085* (2013.01); *H04B 10/613* (2013.01)

(58) Field of Classification Search
CPC ............. H04B 10/616; H04B 10/613; H04B 10/6161; H04B 10/6162; H04B 10/6164; H04B 10/6165; H04B 10/614
USPC ....... 398/202, 208, 209, 205, 206, 207, 212, 398/213, 214, 65, 152, 183, 184, 188, 158, 398/159, 33, 38, 135, 136; 330/59, 308; 250/214 A, 214 LA, 214 AG
See application file for complete search history.

(56) References Cited

U.S. PATENT DOCUMENTS

| | | | |
|---|---|---|---|
| 7,636,525 B1* | 12/2009 | Bontu ................... | H04B 10/60 398/208 |
| 8,463,143 B2* | 6/2013 | Sugimoto .......... | H04B 10/6933 250/200 |

(Continued)

FOREIGN PATENT DOCUMENTS

| | | |
|---|---|---|
| JP | 2012-10187 A | 1/2012 |
| WO | 2009/069814 A1 | 6/2009 |

(Continued)

OTHER PUBLICATIONS

International Search Report for PCT Application No. PCT/JP2013/006435, mailed on Dec. 17, 2013.

(Continued)

*Primary Examiner* — Hanh Phan

(57) ABSTRACT

The common mode rejection ratio (CMRR) decreases due to the difference in receiving intensity of the optical signal or in photoelectric conversion efficiency of the photodiode in the related coherent optical receiver, therefore, an optical receiver according to an exemplary aspect of the present invention includes a first photodiode receiving a first optical signal and outputting a positive signal; a second photodiode receiving a second optical signal and outputting a complementary signal; a differential transimpedance amplifier receiving the positive signal and outputting an amplified positive signal voltage, and receiving the complementary signal and outputting an amplified complementary signal voltage; and a gain adjustment means for adjusting a first gain of a gain of the differential transimpedance amplifier for the positive signal and a second gain of a gain of the differential transimpedance amplifier for the complementary signal.

16 Claims, 8 Drawing Sheets

(51) Int. Cl.
*H03F 3/08* (2006.01)
*H03F 3/45* (2006.01)

(56) References Cited

U.S. PATENT DOCUMENTS 8,483,581 B2* 7/2013 Suzuki .............. H01L 31/02019
398/209
2013/0322876 A1* 12/2013 Gehrke ............ H04B 10/07955
398/38

FOREIGN PATENT DOCUMENTS

WO 2011/132759 A1 10/2011
WO 2012/117951 A1 9/2012

OTHER PUBLICATIONS

English translation of Written Opinion for PCT Application No. PCT/JP2013/006435.

* cited by examiner

OPTICAL RECEIVER, OPTICAL RECEIVING DEVICE, AND METHOD FOR CORRECTING RECEIVED OPTICAL INTENSITY

This application is a National Stage Entry of PCT/JP2013/006435 filed on Oct. 30, 2013, which claims priority from Japanese Patent Application 2012-241996 filed on Nov. 1, 2012, the contents of all of which are incorporated herein by reference, in their entirety.

TECHNICAL FIELD

The present invention relates to optical receivers, optical receiving devices, and methods for correcting received optical intensity, in particular, to an optical receiver, an optical receiving device, and a method for correcting received optical intensity using a coherent detection method corresponding to a quadrature phase-shift keying (QPSK) method.

BACKGROUND ART

With the growth of the Internet and the like, a large-capacity optical communication system has been advanced. For example, in backbone network systems connecting between communication stations, the research and development have been performed for optical transmitters and optical receivers capable of transmitting a signal exceeding 40 Gbit/s per wavelength. If the bit rate per wavelength increases, the increase in signal quality deterioration is caused by the waveform distortion due to decreased resistance to an optical signal-to-noise ratio (OSNR), chromatic dispersion, polarization mode dispersion, non-linear effect in transmission lines. For this reason, in recent years, a digital coherent receiving method with high resistance to OSNR and waveform distortion has been paid attention to. In the digital coherent receiving method, optical intensity information and phase information are extracted from received signals, and the demodulation is performed by means of a digital signal processing technique. By using the digital coherent receiving method, the OSNR resistance is improved by the coherent receiving method, and the compensation for waveform distortion is realized by the digital signal processing technique. Therefore, it is possible to obtain high reliability even in the optical communication system for transmitting signals exceeding 40 Gbit/s.

Patent Literature 1 describes an example of a coherent optical receiving device used for the foregoing digital coherent receiving method. FIG. 7 illustrates a configuration of a related coherent optical receiving device described in Patent Literature 1. The related coherent optical receiving device 5000 receives an optical received signal 5001 and local oscillation light 5002 having almost the same wavelength as that of the optical received signal 5001 from a local oscillation light source. The local oscillation light 5002 and the optical received signal 5001 are made interfere, converting it into an electrical signal (coherent detection). Since the coherent detection method has strong polarization dependence, a single optical receiver can receive only an optical signal having the same polarization state as that of the local oscillation light. Therefore, a polarization separation unit 5010 is provided in an input part of the optical received signal 5001 and separates the optical received signal 5001 into two polarization components orthogonal to each other. As a result, two optical receivers are required in order to receive a string of optical signal, but such disadvantage can be compensated by doubling the information transmission quantity by means of polarization multiplexing.

Each polarization light of the optical received signal 5001 and the local oscillation light 5002 are inputted into an optical 90-degree hybrid circuit 5100. It is possible to obtain, from the optical 90-degree hybrid circuit 5100, four types of output light in total, that is to say, a pair of output light obtained by making each polarization light component and local oscillation light interfere in phase and reverse phase, and a pair of output light obtained by making them interfere with the phase relationship of orthogonal (90 degrees) and inverse orthogonal (−90 degrees). These output optical signals are converted into current signals by two photodiodes 5200 for each pair and inputted into differential transimpedance amplifiers 5300. As a result, a direct-current component is cancelled and only a beat component generated by the optical received signal 5001 and the local oscillation light 5002 can be efficiently extracted. The electrical signals output from the differential transimpedance amplifiers 5300 are in-phase interference components (I component) and quadrature interference components (Q component) of the optical received signal and the local oscillation light, respectively.

The outputs of each polarization, that is, four types of electrical signals in total composed of I component and Q component of X polarization, and I component and Q component of Y polarization, are analog-to-digital (AD) converted at high speed by analog-to-digital conversion units (ADC) 5400, respectively. After being converted into digital information signals, the digital information signals are inputted into a digital signal processing unit (DSP) 5500. The digital signals obtained in this way can be processed for various equalization/decision processing by the digital signal processing technique which is widely used in wireless communication. After such digital signal processing and error correction processing are performed, information signals with ultrahigh-speed (100 Gbit/s, for example) are output.

CITATION LIST

Patent Literature

[PTL1]
WO 2011/132759 (page 3, FIG. 14)

SUMMARY OF INVENTION

Technical Problem

In the related coherent optical receiving device 5000 as mentioned above, a common mode rejection ratio (CMRR) for the optical input into the photodiode 5200 is one of the most important factors that determines the performance required for the coherent optical receiver. CMRR is expressed by the following formula, in which $I_1$ and $I_2$ represent $$CMRR = 20\log\frac{|I_1 - I_2|}{I_1 + I_2}$$

photocurrents generated in two photodiodes (PDs), respectively.

As shown in the formula, CMRR decreases depending on the difference in receiving intensity arising from the difference in optical signal intensity or optical path. If CMRR decreases, the transimpedance amplifier is saturated and its linearity is lowered by an excessive component of the pulse repetition frequency and its harmonics of the local oscillation light. As a result, it becomes difficult to equalize a waveform distortion with a high degree of accuracy in the following digital signal processing.

That is to say, if the difference arises in receiving intensities of optical signals inputted into a pair of photodiodes (PD), or in quantum efficiencies and coupling efficiencies of those photodiodes (PD), the difference also arises in output currents of the pair of photodiodes (PD). FIG. 8 illustrates waveforms of output current signals ($I_{PD1}$, $I_{PD2}$) of two photodiodes (PD1, PD2) in this case.

The difference between output current signals of the pair of photodiodes PD1 and PD2 is divided into the difference in direct current (DC) component and the difference in amplitude component. Patent Literature 1 describes an example of a method for compensating the difference in DC component. The related coherent optical receiver described in Patent Literature 1 is configured to detect photocurrents generated in two photodiodes by means of a photocurrent detection unit and feed them back to a level adjustment unit connected to a differential transimpedance amplifier. It is said that this configuration enables the levels of positive and complementary signals in two feedback closed loops to be adjusted and the difference in receiving intensities of optical signals to be corrected automatically. However, the related coherent optical receiver is not configured to compensate the difference in amplitudes of output currents of a pair of photodiodes (PD).

As mentioned above, it is impossible for the related coherent optical receiver to correct the difference in amplitude of output current signals of a pair of photodiodes which arises due to the difference in receiving intensity of the optical signal or in photoelectric conversion efficiency of the photodiode. Thus, there has been a problem that the common mode rejection ratio (CMRR) decreases for that reason.

The object of the present invention is to provide an optical receiver, an optical receiving device, and a method for correcting received optical intensity that solve the problem mentioned above that the common mode rejection ratio (CMRR) decreases due to the difference in receiving intensity of the optical signal or in photoelectric conversion efficiency of the photodiode in the related coherent optical receiver.

Solution to Problem

An optical receiver according to an exemplary aspect of the present invention includes a first photodiode receiving a first optical signal and outputting a positive signal; a second photodiode receiving a second optical signal and outputting a complementary signal; a differential transimpedance amplifier receiving the positive signal and outputting an amplified positive signal voltage, and receiving the complementary signal and outputting an amplified complementary signal voltage; and a gain adjustment means for adjusting a first gain of a gain of the differential transimpedance amplifier for the positive signal and a second gain of a gain of the differential transimpedance amplifier for the complementary signal.

A method for correcting received optical intensity according to an exemplary aspect of the present invention includes receiving a first optical signal, converting the first optical signal into an electrical signal, and outputting a positive signal; receiving a second optical signal, converting the second optical signal into an electrical signal, and outputting a complementary signal; amplifying the positive signal and the complementary signal and outputting a positive signal voltage and a complementary signal voltage; and adjusting a first gain for the positive signal voltage and a second gain for the complementary signal voltage respectively so that a voltage amplitude of the positive signal voltage may become almost equal to a voltage amplitude of the complementary signal voltage.

Advantageous Effects of Invention

According to the optical receiver of the present invention, it is possible to suppress a decline in common mode rejection ratio (CMRR) arising due to the difference in receiving intensity of optical signals or in photoelectric conversion efficiency of photodiodes.

DESCRIPTION OF EMBODIMENTS

The exemplary embodiments of the present invention will be described with reference to drawings below.

The First Exemplary Embodiment

Figure 1:
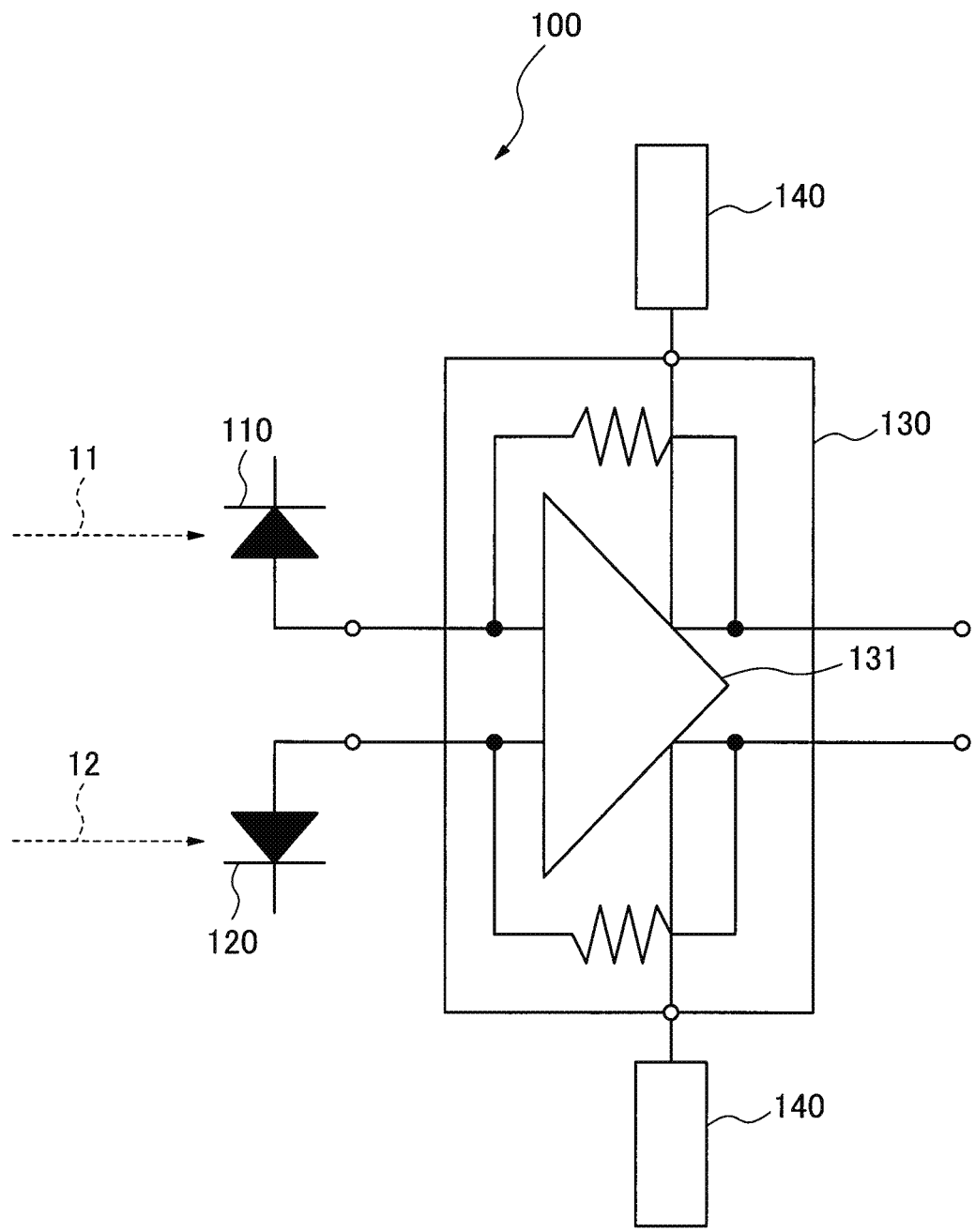
FIG. 1 is a block diagram illustrating a configuration of an optical receiver in accordance with the first exemplary embodiment of the present invention.

FIG. 1 is a block diagram illustrating a configuration of an optical receiver in accordance with the first exemplary embodiment of the present invention. An optical receiver 100 includes a first photodiode 110, a second photodiode 120, a differential transimpedance amplifier 130, and a gain adjustment unit 140.

The first photodiode 110 receives a first optical signal 11 and outputs a positive signal. The second photodiode 120 receives a second optical signal 12 and outputs a complementary signal. The differential transimpedance amplifier 130 receives the positive signal and outputs an amplified positive signal voltage, and receives the complementary signal and outputs an amplified complementary signal voltage. The gain adjustment unit 140 adjusts a first gain which is a gain of the differential transimpedance amplifier 130 for the positive signal and a second gain which is a gain of the differential transimpedance amplifier 130 for the complementary signal, respectively.

By adopting the configuration, it becomes possible to adjust the first gain for the positive signal voltage and the second gain for the complementary signal voltage respectively so that the voltage amplitude of the positive signal voltage may become almost identical to the voltage amplitude of the complementary signal voltage. Therefore, according to the optical receiver 100 in the present exemplary embodiment, it is possible to correct the difference in amplitudes between output current signals of a pair of photodiodes which arises due to the difference in receiving intensity of optical signals or in photoelectric conversion efficiency of photodiodes. As a result, it is possible to suppress a decline in common mode rejection ratio (CMRR) in the optical receiver 100.

The differential transimpedance amplifier 130 can be configured to include a differential amplifier 131, and the gain adjustment unit 140 can be configured to include a variable impedance unit connected to the differential amplifier 131. In such configuration, the variable impedance unit can be configured for the impedance to vary corresponding to the adjustable range of the first gain and the second gain.

Figure 2:
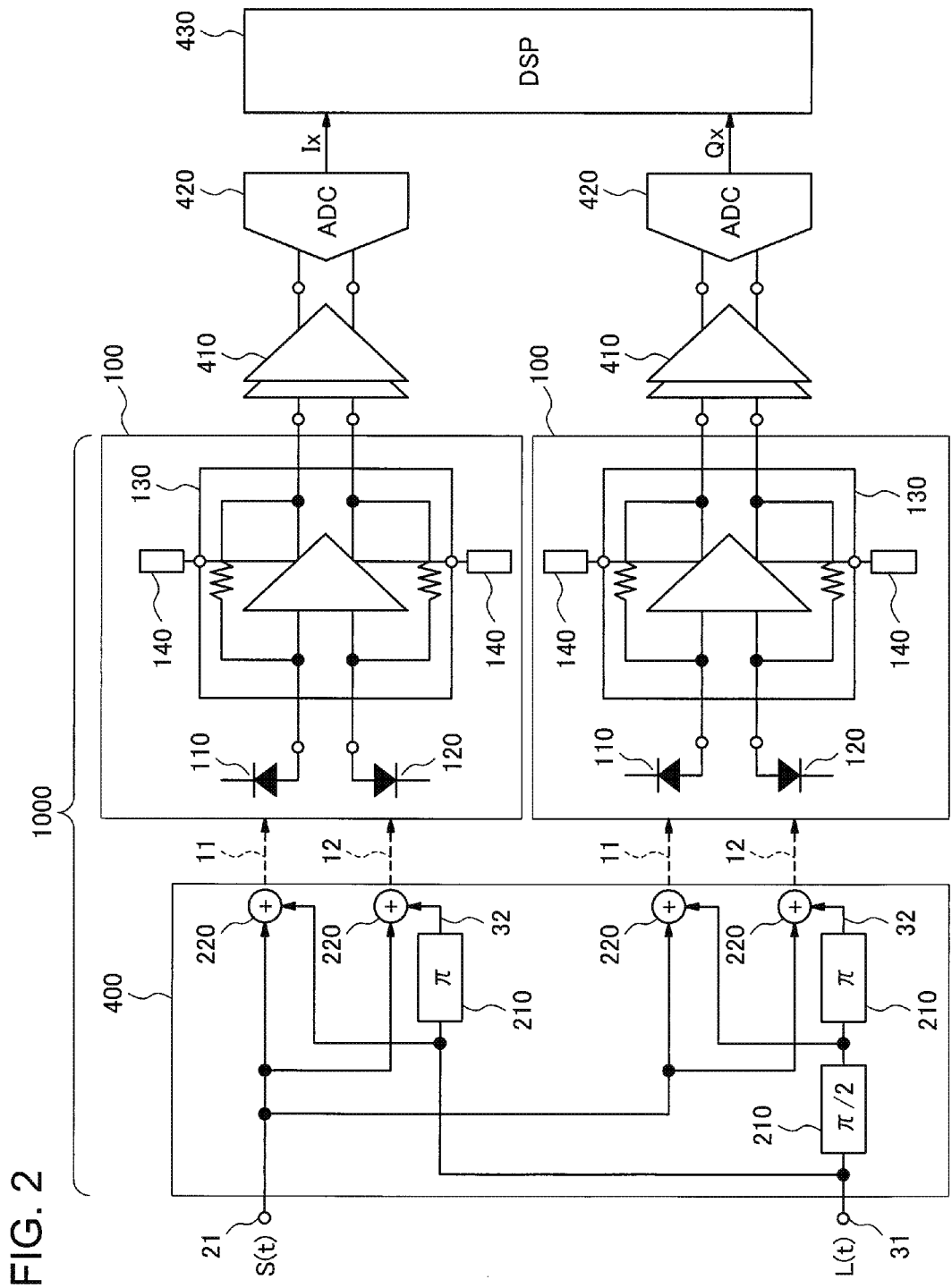
FIG. 2 is a block diagram illustrating a configuration of an optical receiving device in accordance with the first exemplary embodiment of the present invention.

Next, it will be described in more detail to use the optical receiver 100 in an optical receiving device employing a coherent detection method. FIG. 2 is a block diagram illustrating a configuration of an optical receiving device in accordance with the first exemplary embodiment of the present invention. FIG. 2 illustrates only one polarization (X) part of the optical receiving device employing a coherent detection method (hereinafter, referred to as a coherent optical receiving device). The coherent optical receiving device 1000 includes the optical receiver 100 and an optical 90-degree hybrid circuit 400. The coherent optical receiving device 1000 is used connecting a variable gain amplifier 410, an analog-to-digital conversion unit (ADC) 420, and a digital signal processing circuit (DSP) 430 in its following stage.

If the coherent detection method is employed, the first optical signal 11 is a first interference optical signal obtained by making an optical received signal 21 interfere with first local oscillation light 31 whose wavelength is almost the same as that of the optical received signal 21. The second optical signal 12 is a second interference optical signal obtained by making the optical received signal 21 interfere with second local oscillation light 32 whose phase is reversed with respect to the first local oscillation light 31. That is to say, the optical 90-degree hybrid circuit 400 makes the optical received signal 21 interfere with the first local oscillation light 31 and outputs the first interference optical signal, and makes the optical received signal 21 interfere with the second local oscillation light 32 and outputs the second interference optical signal.

As mentioned above, the optical receiver 100 includes the first photodiode 110, the second photodiode 120, the differential transimpedance amplifier 130, and the gain adjustment unit 140. The optical 90-degree hybrid circuit 400 includes an optical phase shifter 210 and an optical mixer 220. The optical received signal 21 is an optical received signal after having been split into an X polarization component and a Y polarization component by means of a polarization beam splitter. Into the first photodiode 110 and the second photodiode 120, optical signals are inputted which are obtained by making the optical received signal 21 interfere with the first local oscillation light 31 or the second local oscillation light 32 in the optical 90-degree hybrid circuit 400.

The gain adjustment unit 140 is connected to the differential transimpedance amplifier 130. The gain adjustment unit 140 has a function to adjust the difference in amplitude between the output current signal of the first photodiode 110 and that of the second photodiode 120. That is to say, the gain adjustment unit 140 individually adjusts a transimpedance gain of a positive or complementary loop in the differential transimpedance amplifier 130 having a negative feedback so as to cancel the difference in amplitude between output current signals of two photodiodes. Therefore, it is possible to obtain demodulation signals whose amplitudes are almost the same and which have a positive and complementary relationship at the output of the differential transimpedance amplifier 130. The output of the differential transimpedance amplifier 130 is amplified by the variable gain amplifier 410 which is connected to the following stage, and is analog-to-digital converted by the analog-to-digital conversion unit (ADC) 420. Then the digital signal processing circuit (DSP) 430 performs digital signal processes such as a polarization demultiplexing process, a light source frequency offset compensation process, and a phase compensation process. The differential transimpedance amplifier 130 can be also configured to include the variable gain amplifier 410.

Next, the principle of a coherent receiving method with a quadrature phase-shift keying (QPSK) optical signal will be described. In the optical 90-degree hybrid circuit 400, the optical received signal 21 is split into four components by an optical coupler. On the other hand, the local oscillation light is split into four components by an optical coupler and each phase of the four split components is shifted by 0, $\pi$, $\pi/2$, or $3\pi/2$. Then the interfering light obtained by making the optical received signal 21 interfere with each of the split local oscillation light is inputted into the first photodiode 110 and the second photodiode 120, respectively.

If the optical received signal is represented by S(t) and the local oscillation light is represented by L(t), they are expressed respectively as follows.

$$S(t)=A(t)e^{j\omega_1 t+j\phi(t)}$$

$$L(t)=Be^{\omega t}$$

In the above-mentioned formulae, $\omega_1$ and $\omega$ represent angular frequencies (=$2\pi\times$light speed/wavelength) of the optical received signal S(t) and the local oscillation light L(t), respectively. And $\phi$ represents a phase. In the phase modulation method, transmission information is carried on the phase. For example, in the QPSK method, the phases are 0, $\pi$, $\pi/2$, and $3\pi/2$.

If the wavelength of the optical received signal S(t) is consistent with that of the local oscillation light L(t) ($\omega_1=\omega$), the output of each photodiode (PD) is expressed by the following formulae when the interference light of the optical received signal S(t) and the local oscillation light L(t) is inputted.

$$|S(t)+L(t)|^2=a\{A(t)^2+B^2+2A(t)B\cos(\phi(t))\} \quad (1)$$

$$|S(t)-L(t)|^2=b\{A(t)^2+B^2-2A(t)B\cos(\phi(t))\} \quad (2)$$

$$|S(t)+jL(t)|^2=c\{A(t)^2+B^2+2A(t)B\sin(\phi(t))\} \quad (3)$$

$$|S(t)-jL(t)|^2=d\{A(t)^2+B^2-2A(t)B\sin(\phi(t))\} \quad (4)$$

The symbols of a, b, c, and d in the above-mentioned formulae are coefficients resulting from a quantum efficiency and a coupling efficiency of each photodiode (PD), and a loss in the optical 90-degree hybrid circuit 400. The second term on the right-hand side in that from formula (1) to formula (4) expresses a DC component (offset component) and the third term expresses phase information of the signal.

By using the formulae from (1) to (4), the outputs of the differential transimpedance amplifier 130 are expressed by the following formulae.

$$|S(t)+L(t)|^2-(|S(t)-L(t)|^2)=(a-b)\{A(t)^2+B^2\}+ 2(a+b)A(t)B\cos(\phi(t))$$ (5)

$$|S(t)-L(t)|^2-(|S(t)+L(t)|^2)=(b-a)\{A(t)^2+B^2\}- 2(b+a)A(t)B\cos(\phi(t))$$ (6)

$$|S(t)+jL(t)|^2-(|S(t)-jL(t)|^2)=(c-d)\{A(t)^2+B^2\}+ 2(c+d)A(t)B\sin(\phi(t))$$ (7)

$$|S(t)-jL(t)|^2-(|S(t)+jL(t)|^2)=(d-c)\{A(t)^2+B^2\}- 2(d+c)A(t)B\sin(\phi(t))$$ (8)

Among the above-mentioned formulae, a differential signal between formula (5) and formula (6), and a differential signal between formula (7) and formula (8) become outputs of the differential transimpedance amplifier 130.

Since the light intensity $B^2$ of the local oscillation light is more than ten times larger than the light intensity $A^2$ of the optical received signal, the light intensity $B^2$ of the local oscillation light becomes dominant. However, if a difference arises between the coefficient of a and the coefficient of b in formula (5) and formula (6), or between the coefficient of c and the coefficient of d in formula (7) and formula (8), the term of the light intensity $A(t)^2$ of the optical received signal appears in the output of the differential transimpedance amplifier 130. According to the optical receiver 100 in the present exemplary embodiment, it is possible to adjust the gain of the differential transimpedance amplifier 130 individually by the gain adjustment unit 140. If each gain of the differential transimpedance amplifier 130 for each signal is represented by $\alpha$, $\beta$, $\gamma$, and $\delta$, the outputs of the differential transimpedance amplifier 130 are expressed respectively by the following formulae.

$$\alpha|S(t)+L(t)|^2-(\beta|S(t)-L(t)|^2)=(a\alpha-b\beta)\{A(t)^2+B^2\}+ 2(a\alpha+b\beta)A(t)B\cos(\phi(t))$$ (9)

$$\beta|S(t)-L(t)|^2-(\alpha|S(t)+L(t)|^2)=(b\beta-a\alpha)\{A(t)^2+B^2\}- 2(a\beta+a\alpha)A(t)B\cos(\phi(t))$$ (10)

$$\gamma|S(t)+jL(t)|^2-(\delta|S(t)-jL(t)|^2)=(c\gamma-d\delta)\{A(t)^2+B^2\}+ 2(c\gamma+d\delta)A(t)B\sin(\phi(t))$$ (11)

$$\delta|S(t)-jL(t)|^2-(\gamma|S(t)+jL(t)|^2)=(d\delta-c\gamma)\{A(t)^2+B^2\}- 2(d\delta+c\gamma)A(t)B\sin(\phi(t))$$ (12)

Among the above-mentioned formulae, a differential signal between formula (9) and formula (10), and a differential signal between formula (11) and formula (12) appear in the output of the differential transimpedance amplifier 130. Adjusting $\alpha$, $\beta$, $\gamma$, and $\delta$ by the gain adjustment unit 140 makes it possible to eliminate the difference in the term of light intensity $A(t)^2$ of the optical received signal. That is to say, it is possible to make the voltage amplitude of the positive signal voltage almost equal to the voltage amplitude of the complementary signal voltage by adjusting first gains ($\alpha$, $\gamma$) of the differential transimpedance amplifier 130 for the positive signal voltage and second gains ($\beta$, $\delta$) of the differential transimpedance amplifier 130 for the complementary signal voltage.

As mentioned above, the optical receiver 100 in the present exemplary embodiment is configured to provide the differential transimpedance amplifier 130 with the gain adjustment unit 140 to adjust the gain of the differential transimpedance amplifier 130. Therefore, it becomes possible to adjust the gain so as to cancel the difference in amplitude between output current signals of two photodiodes (PDs). That is to say, it is possible to obtain appropriate positive and complementary signals with the same amplitudes and no noise as outputs of the differential transimpedance amplifier. As a result, it becomes possible to compensate, in the differential transimpedance amplifier, the deterioration of the common mode rejection ratio (CMRR) arising in an optical 90-degree hybrid circuit or photodiodes.

Next, a method for correcting received optical intensity in accordance with the present exemplary embodiment will be described. In the method for correcting received optical intensity in accordance with the present exemplary embodiment, first, a first optical signal is received and converted into an electrical signal, and a positive signal is output. Similarly, a second optical signal is received and converted into an electrical signal, and a complementary signal is output. This is followed by amplifying the positive signal and the complementary signal and by outputting a positive signal voltage and a complementary signal voltage. A first gain for the positive signal voltage and a second gain for the complementary signal voltage are adjusted respectively so that the voltage amplitude of the positive signal voltage may become almost equal to the voltage amplitude of the complementary signal voltage. It is possible to make adjustments for the first gain and the second gain by adjusting the impedance of an amplifier having the function of amplification.

According to the method for correcting received optical intensity in accordance with the present exemplary embodiment, it is also possible to suppress a decline in common mode rejection ratio (CMRR) arising due to the difference in receiving intensity of optical signals or in photoelectric conversion efficiency of photodiodes.

The Second Exemplary Embodiment

Figure 3:
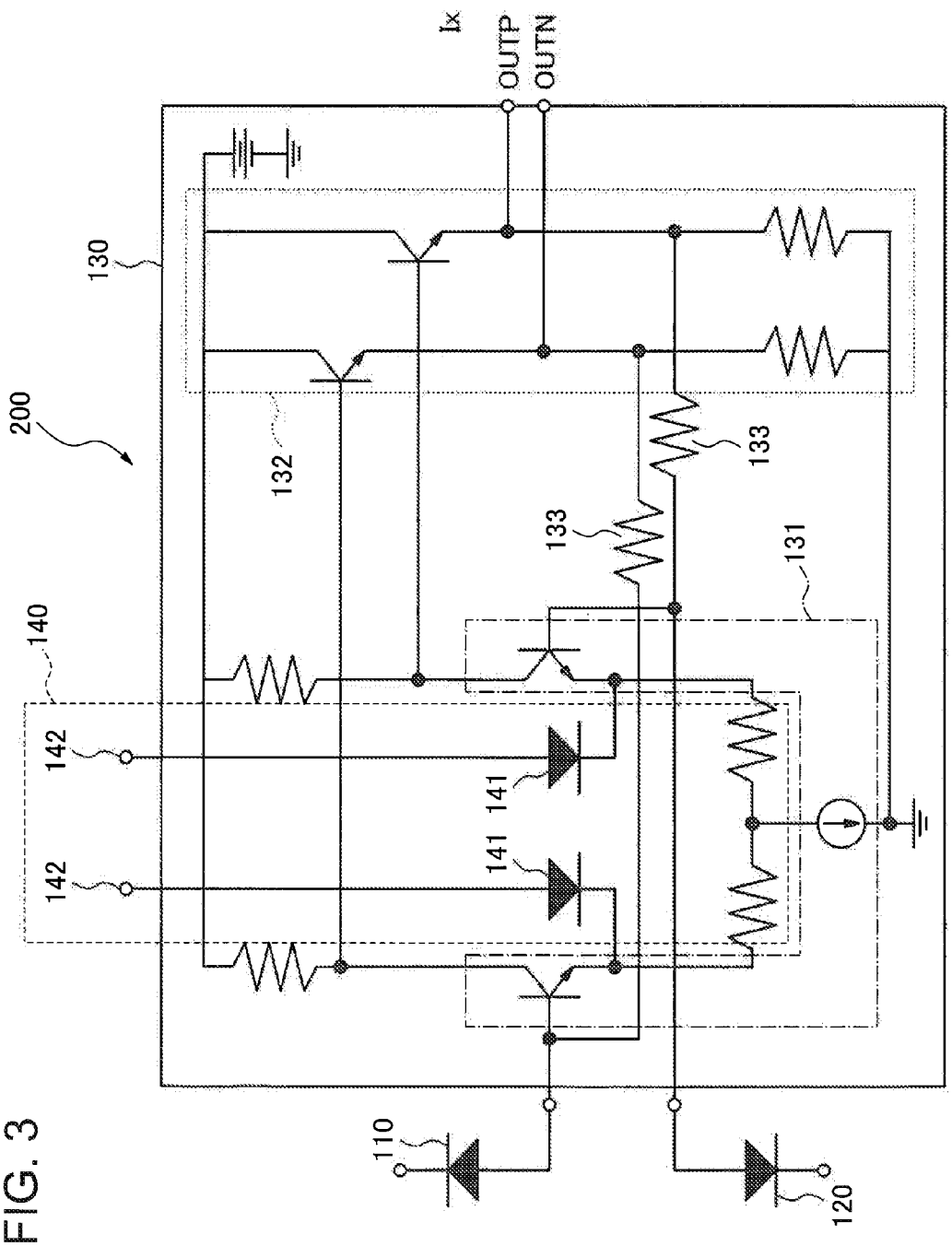
FIG. 3 is a circuit configuration diagram illustrating a configuration of a coherent optical receiver in accordance with the second exemplary embodiment of the present invention.

Next, the second exemplary embodiment of the present invention will be described. In the present exemplary embodiment, a case is described where a coherent optical receiver employing a coherent detection method is used as an optical receiver. FIG. 3 is a circuit configuration diagram illustrating a configuration of a coherent optical receiver 200 in accordance with the second exemplary embodiment of the present invention. FIG. 3 illustrates only an I channel (Ix) of one polarization (X) part of the coherent optical receiver. The same configurations as those of the optical receiver 100 in accordance with the first exemplary embodiment are indicated by the same reference signs.

The coherent optical receiver 200 includes the first photodiode 110, the second photodiode 120, the differential transimpedance amplifier 130, and the gain adjustment unit 140. The coherent optical receiver 200 composes a coherent optical receiving device with the optical 90-degree hybrid circuit 400.

The differential transimpedance amplifier 130 includes a differential amplifier 131 into which output current signals of the first photodiode 110 and the second photodiode 120 are inputted, an emitter follower circuit 132, and two feedback resistors 133. The differential amplifier 131 is configured to include differential pair transistors and a current source.

The gain adjustment unit 140 includes a variable impedance unit 141 connected to the differential amplifier 131.

One end of the variable impedance unit 141 is connected to the ground side of the differential amplifier 131, the other end of it is connected to a control terminal 142, and the impedance varies depending on a voltage applied to the control terminal 142. The variable impedance unit 141 can be configured to include one of a diode element and a transistor element. In the following, as illustrated in FIG. 3, a case where a diode element is used as the variable impedance unit 141 will be described in more detail.

As illustrated in FIG. 3, resistance elements and diode elements are connected to the emitter sides of the differential pair transistors composing the differential amplifier 131, respectively. The control terminal 142 is connected to the anode side of the diode element. It is possible to vary individually the impedance on the emitter sides of the differential pair transistors by varying the voltage of the control terminal 142 from one diode element to another. As a result, it becomes possible to vary individually the gain for the positive signal and the complementary signal of the differential amplifier 131.

The reason why the emitter impedance of the differential pair transistors varies is as follows. The emitter impedance of the differential pair transistors is determined by the resistance element connected to the emitter side of the differential pair transistors and the internal resistance of the diode element. It is because the internal resistance of the diode element varies due to changing the voltage on the anode side of the diode element.

The transimpedance gain $Z_T$ of the differential transimpedance amplifier 130 is expressed by the following formula.

$$Z_T = R_F \cdot \frac{A_o}{1+A_o} = R_F \cdot \left(\frac{R_C}{R_E} I_C \bigg/ \left(1 + \frac{R_C}{R_E} I_C\right)\right) = R_F \cdot \frac{R_C I_C}{R_E + R_C I_C} \quad (13)$$

Here, $R_F$ represents a feedback resistance, $A_O$ represents a gain of a differential amplifier, $R_C$ represents a load resistance of the differential amplifier, $R_E$ represents an emitter impedance of differential pair transistors, and $I_C$ represents a current of a current source in the differential amplifier. As can be seen from formula (13), the transimpedance gain $Z_T$ depends on the emitter impedance $R_E$, and the transimpedance gain $Z_T$ increases if the emitter impedance $R_E$ is reduced.

Figure 4:
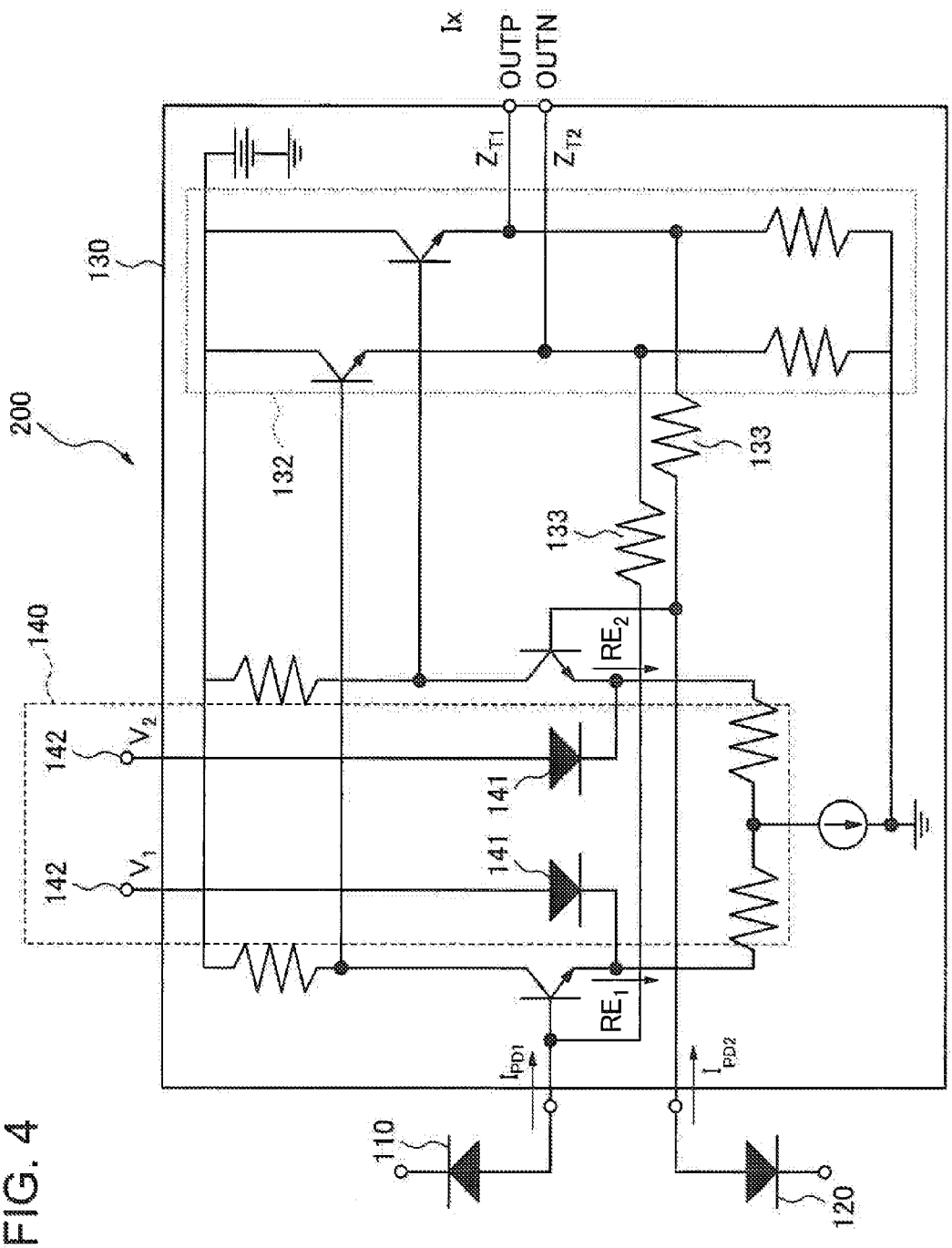
FIG. 4 is a circuit configuration diagram to describe the operation of a coherent optical receiver in accordance with the second exemplary embodiment of the present invention.

Next, the operation of the coherent optical receiver 200 in the present exemplary embodiment will be described. FIG. 4 is a circuit configuration diagram to describe the operation of the coherent optical receiver 200 in the present exemplary embodiment. The configuration of the coherent optical receiver 200 is the same as that illustrated in FIG. 3.

If there is no difference in amplitude between an output current signal $I_{PD1}$ output from the first photodiode 110 and an output current signal $I_{PD2}$ output from the second photodiode 120 ($I_{PD1}=I_{PD2}$), the control terminals 142 composing the gain adjustment unit 140 are controlled to have the same potential ($V_1=V_2$). In this case, the transimpedance gain of the differential transimpedance amplifier 130 for a positive signal is the same as that for a complementary signal. Therefore, a positive signal voltage and a complementary signal voltage whose amplitudes are the same are output to output terminals (OUTP, OUTN) of the differential transimpedance amplifier 130.

If there arises a difference in amplitude of output current signals between the first photodiode 110 and the second photodiode 120 ($I_{PD1}>I_{PD2}$, for example), the control terminals 142 composing the gain adjustment unit 140 are set so that the electrical potential differs from each other. That is to say, the electrical potential $V_1$ of the control terminal 142 connected to the first photodiode 110 is set so as to become smaller than the electrical potential $V_2$ of the control terminal connected to the second photodiode 120 ($V_1<V_2$). This configuration makes the impedance on the emitter sides RE of the differential pair transistors composing the differential amplifier 131 different values. That is to say, the impedance $RE_1$ on the side connected to the first photodiode 110 becomes larger than the impedance $RE_2$ on the side connected to the second photodiode 120 ($RE_1>RE_2$). The values of the transimpedance gain Z of the differential transimpedance amplifier 130 also differ from each other according to above-mentioned formula (13). That is to say, the gain $Z_{T1}$ of the differential transimpedance amplifier 130 on the side connected to the first photodiode 110 becomes smaller than the gain $Z_{T2}$ of the differential transimpedance amplifier 130 on the side connected to the second photodiode 120 ($Z_{T1}<Z_{T2}$). As a result, the difference in amplitude of output current signals between the first photodiode 110 and the second photodiode 120 is cancelled, and a positive signal voltage and a complementary signal voltage with their amplitudes being the same are output to the output terminals (OUTP, OUTN) of the differential transimpedance amplifier 130.

Figure 5:
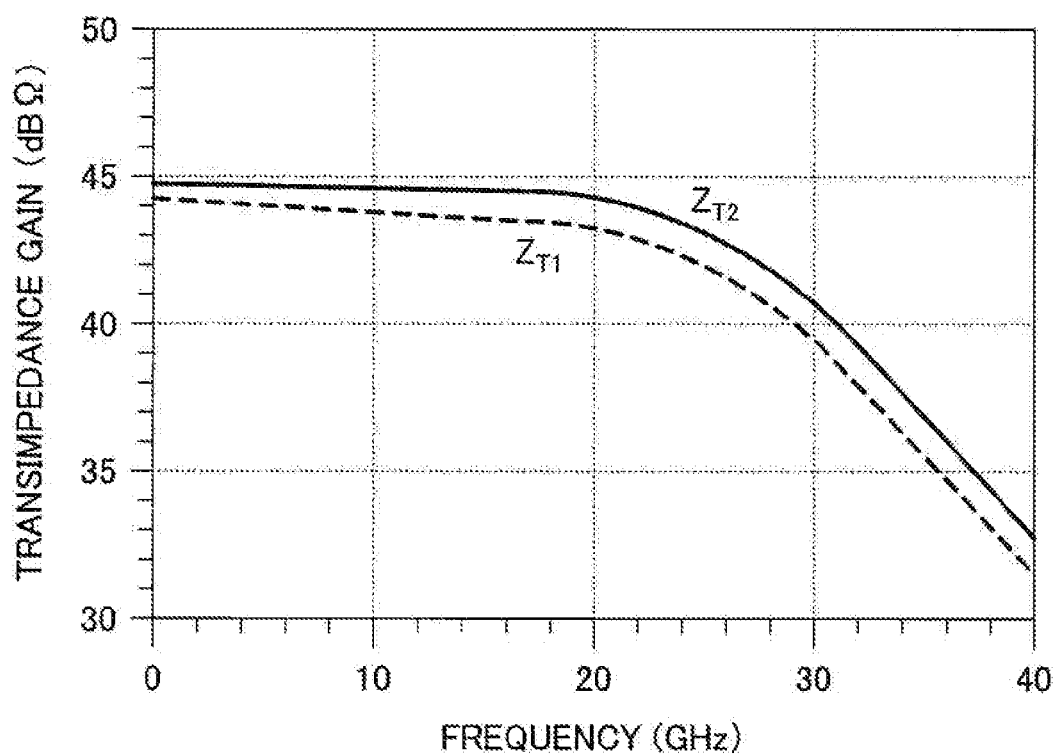
FIG. 5 is a diagram illustrating the frequency dependence of gain of a differential transimpedance amplifier composing the coherent optical receiver in accordance with the second exemplary embodiment of the present invention.

FIG. 5 illustrates the frequency dependence of the gain (transimpedance gain) of the differential transimpedance amplifier 130. It can be seen from FIG. 5 that the gain $Z_{T1}$ of the differential transimpedance amplifier 130 on the side connected to the first photodiode 110 becomes smaller than the gain $Z_{T2}$ of the differential transimpedance amplifier 130 on the side connected to the second photodiode 120.

In the foregoing description, the gain adjustment unit 140 to adjust the transimpedance gain of the differential transimpedance amplifier 130 is configured to include a resistance element and a diode element which are connected to the emitter sides of the differential pair transistors. However, it is not limited to this, it is also acceptable to use a gain adjustment unit with any other configuration such as a configuration including a transistor element instead of a diode element as long as a configuration enables to vary the impedance on the emitter sides of differential pair transistors.

In the foregoing description, the gain adjustment unit 140 is configured to adjust the gains of positive and complementary loops of the differential transimpedance amplifier 130 by changing the impedance on the emitter sides of the differential pair transistors. However, it is not limited to this, a gain adjustment unit with other configuration is also acceptable which can be configured to adjust the gain of the differential transimpedance amplifier 130 by changing a load resistance of a differential pair or a feedback resistance, for example. It is possible to adjust the transimpedance gain without generating a difference in the band characteristics of the transimpedance gain by means of the above-mentioned gain adjustment unit 140 which is configured to vary the impedance on the emitter side. Therefore, that gain adjustment unit 140 is configured to be particularly suitable for practical use.

As described above, the coherent optical receiver 200 according to the present exemplary embodiment is configured for the differential transimpedance amplifier 130 to include the gain adjustment unit 140 which adjusts the gain of the differential transimpedance amplifier 130. Therefore, adjusting the gain of the differential transimpedance amplifier 130 makes it possible to eliminate the difference in amplitude between output signals of the differential transimpedance amplifier 130 which arises due to the difference in amplitude between output current signals of two photodiodes (PDs). That is to say, it becomes possible to compensate, in the differential transimpedance amplifier, the deterioration of the common mode rejection ratio (CMRR) arising in an optical 90-degree hybrid circuit or photodiodes.

The Third Exemplary Embodiment

Figure 6:
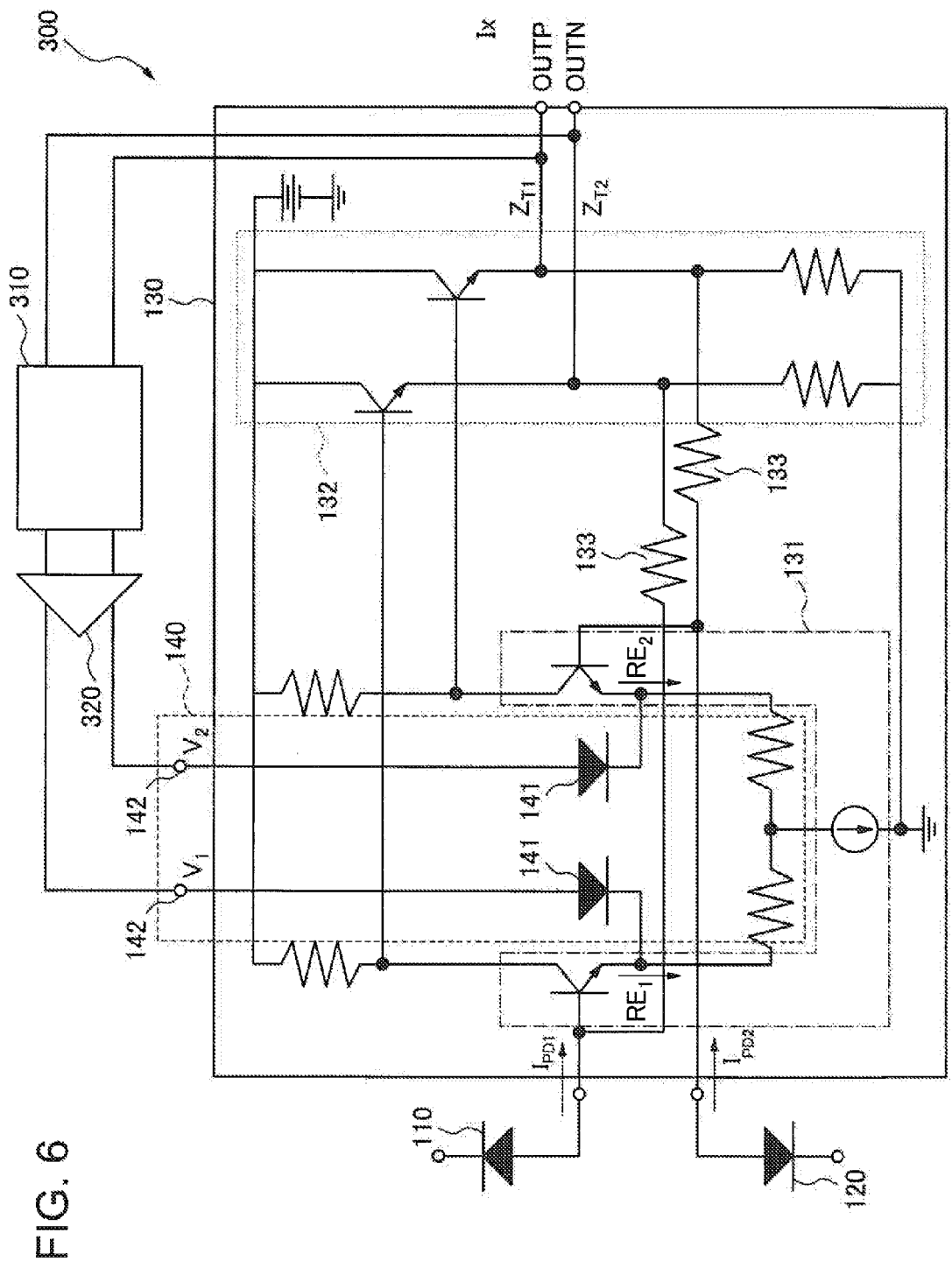
FIG. 6 is a circuit configuration diagram illustrating a configuration of a coherent optical receiver in accordance with the third exemplary embodiment of the present invention.
Figure 7:
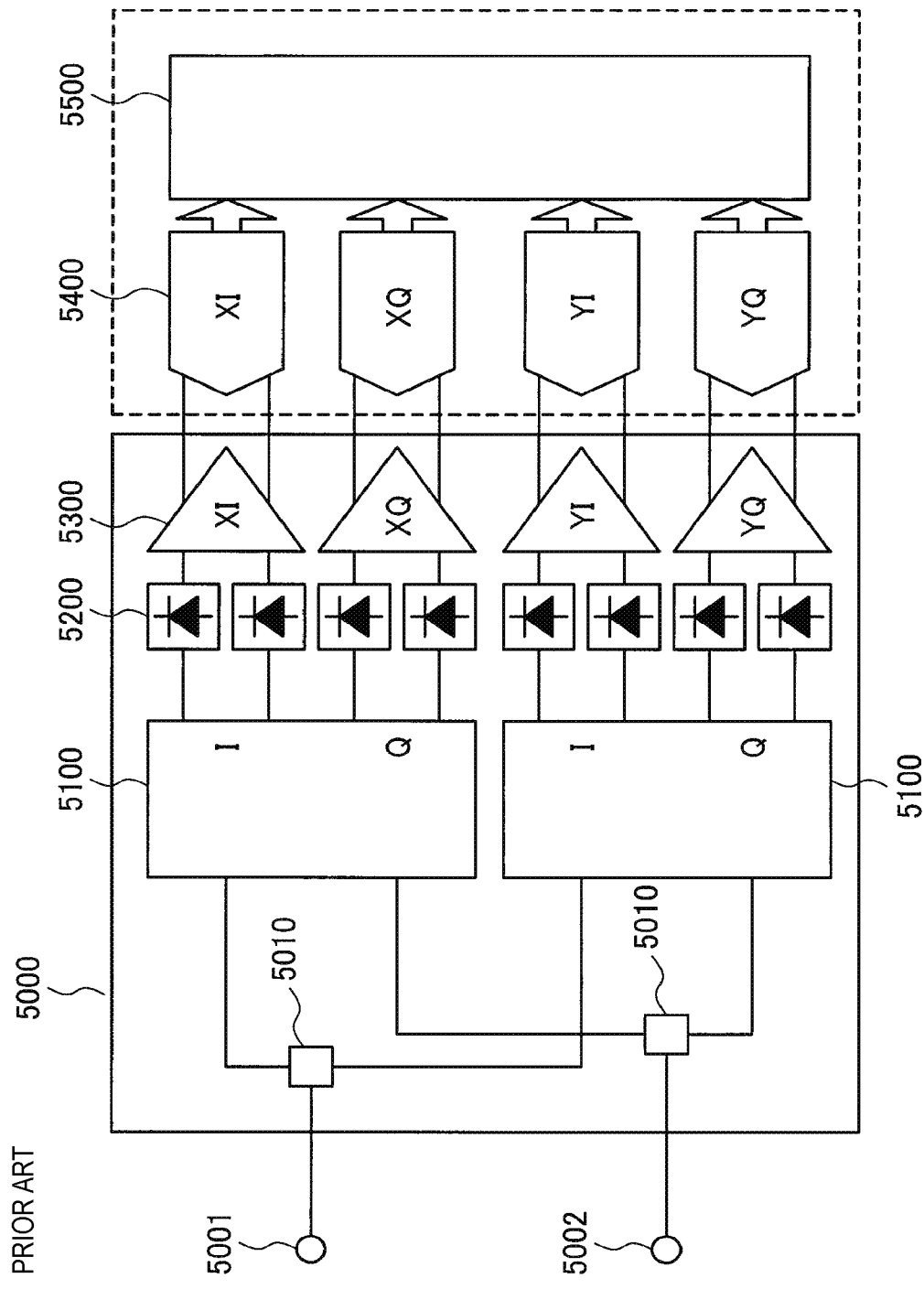
FIG. 7 is a block diagram illustrating a configuration of a related coherent optical receiving device.
Figure 8:
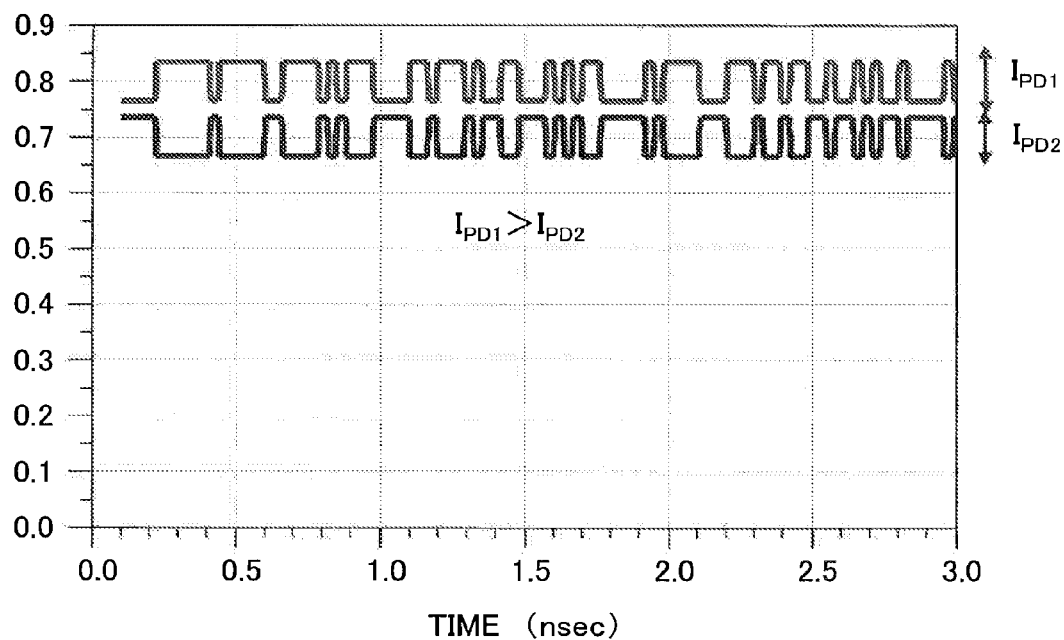
FIG. 8 is a waveform diagram of output currents of a pair of photodiodes (PD) in the related coherent optical receiving device.

Next, the third exemplary embodiment of the present invention will be described. In the present exemplary embodiment, a case is described where a coherent optical receiver employing a coherent detection method is used as an optical receiver. FIG. 6 is a circuit configuration diagram illustrating a configuration of a coherent optical receiver 300 in accordance with the third exemplary embodiment of the present invention. FIG. 6 illustrates only an I channel (Ix) of one polarization (X) part of the coherent optical receiver. The same configurations as those of the coherent optical receiver 200 in accordance with the second exemplary embodiment are indicated by the same reference signs.

The coherent optical receiver 300 includes the first photodiode 110, the second photodiode 120, the differential transimpedance amplifier 130, and the gain adjustment unit 140. The coherent optical receiver 300 in the present exemplary embodiment differs from the coherent optical receiver 200 in the second exemplary embodiment in a configuration of further including a peak detection unit 310 and a level conversion unit 320. The coherent optical receiver 300 composes a coherent optical receiving device with the optical 90-degree hybrid circuit 400.

Into the first photodiode 110 and the second photodiode 120, optical signals are inputted which are obtained by making the optical received signal 21 interfere with the first local oscillation light 31 or the second local oscillation light 32 in the optical 90-degree hybrid circuit 400 (see FIG. 2). The optical received signal 21 is an optical received signal after having been split into an X polarization component and a Y polarization component by means of a polarization beam splitter.

The differential transimpedance amplifier 130 includes the differential amplifier 131 into which output current signals of the first photodiode 110 and the second photodiode 120 are inputted, the emitter follower circuit 132, and two feedback resistors 133. The differential amplifier 131 is configured to include differential pair transistors and a current source.

The gain adjustment unit 140 includes the variable impedance unit 141 connected to the differential amplifier 131. One end of the variable impedance unit 141 is connected to the ground side of the differential amplifier 131, the other end of it is connected to the control terminal 142, and the impedance varies depending on a voltage applied to the control terminal 142. The variable impedance unit 141 can be configured to include one of a diode element and a transistor element. In the following, as illustrated in FIG. 6, a case where a diode element is used as the variable impedance unit 141 will be described in more detail.

As illustrated in FIG. 6, resistance elements and diode elements are connected to the emitter sides of the differential pair transistors composing the differential amplifier 131, respectively. The control terminal 142 is connected to the anode side of the diode element. It is possible to vary individually the impedance on the emitter sides of the differential pair transistors by varying the voltage of the control terminal 142 from one diode element to another. As a result, it becomes possible to vary individually the gain for the positive signal and the complementary signal of the differential amplifier 131.

In the coherent optical receiver 300 in the present exemplary embodiment, the peak detection unit 310 detects voltage amplitudes of a positive signal voltage (OUTP) and a complementary signal voltage (OUTN) output from the differential transimpedance amplifier 130, respectively. And it is configured to feed back the detected voltage amplitudes to the gain adjustment unit 140. It can be configured that the level of the detected voltage amplitude is converted by the level conversion unit 320 and applied to the control terminals 142 in the gain adjustment unit 140. Practical circuit configurations of the peak detection unit 310 and the level conversion unit 320 are not limited in particular, and a generally-used voltage difference detection circuit and voltage amplification circuit can be used.

Next, the operation of the coherent optical receiver 300 in the present exemplary embodiment will be described. First, a case will be considered where there is no difference in amplitude between an output current signal $I_{PD1}$ output from the first photodiode 110 and an output current signal $I_{PD2}$ output from the second photodiode 120 ($I_{PD1}=I_{PD2}$). In this case, as described in the second exemplary embodiment, a positive signal voltage and a complementary signal voltage whose amplitudes are the same are output to output terminals (OUTP, OUTN) of the differential transimpedance amplifier 130. Since this makes the peak detection unit 310 output the same electrical potential, the same electrical potential is also set to the control terminals 142 through the level conversion unit 320. In this case, the transimpedance gain of the differential transimpedance amplifier 130 for a positive signal is the same as that for a complementary signal.

Next, a case will be considered where there arises a difference in amplitude of output current signals between the first photodiode 110 and the second photodiode 120 ($I_{PD1}>I_{PD2}$, for example). In this case, in a configuration other than the present exemplary embodiment, a positive signal voltage and a complementary signal voltage whose amplitudes differs from each other are output to the output terminals (OUTP, OUTN) of the differential transimpedance amplifier 130. Then, in the coherent optical receiver 300 according to the present exemplary embodiment, the peak detection unit 310 detects the positive signal voltage and the complementary signal voltage.

A difference in level corresponding to the difference in amplitude detected by the peak detection unit 310 is converted into an appropriate voltage range ($V_1$, $V_2$) by the level conversion unit 320 and inputted into the control terminals 142. It is fed back then so that the electrical potential $V_1$ at the control terminal 142 on the side connected to the first photodiode 110 may become smaller than the electrical potential $V_2$ at the control terminal on the side connected to the second photodiode 120 ($V_1<V_2$). As a result, as described in the second exemplary embodiment, the gain $Z_{T1}$ of the differential transimpedance amplifier 130 on the side connected to the first photodiode 110 becomes smaller than the gain $Z_{T2}$ of the differential transimpedance amplifier 130 on the side connected to the second photodiode 120 ($Z_{T1}<Z_{T2}$). This feedback control is repeated until a positive signal voltage and a complementary signal voltage with their amplitudes being the same are output to the output terminals (OUTP, OUTN) of the differential transimpedance amplifier 130. As a result, according to the coherent optical receiver 300 in the present exemplary embodiment, a positive signal voltage and a complementary signal voltage with their amplitudes being the same are automatically output from the differential transimpedance amplifier 130.

As described above, according to the coherent optical receiver 300 in the present exemplary embodiment, the gain of the differential transimpedance amplifier 130 is automatically adjusted. As a result, it is possible to automatically eliminate the difference in amplitude between output signals of the differential transimpedance amplifier 130 which arises due to the difference in amplitude between output current signals of two photodiodes (PDs). That is to say, it becomes possible to automatically compensate, in the differential transimpedance amplifier, the deterioration of the common mode rejection ratio (CMRR) arising in an optical 90-degree hybrid circuit or photodiodes.

The present invention is not limited to the aforementioned exemplary embodiments. Various modifications can be made therein within the scope of the present invention as defined by the claims, and obviously, such modifications are included in the scope of the present invention.

This application is based upon and claims the benefit of priority from Japanese Patent Application No. 2012-241996, filed on Nov. 1, 2012, the disclosure of which is incorporated herein in its entirety by reference.

REFERENCE SIGNS LIST

100 Optical receiver
110 First photodiode
120 Second photodiode
130 Differential transimpedance amplifier
131 Differential amplifier
132 Emitter follower circuit
133 Feedback resistor
140 Gain adjustment unit
141 Variable impedance unit
142 Control terminal
200, 300 Coherent optical receiver
210 Optical phase shifter
220 Optical mixer
310 Peak detection unit
320 Level conversion unit
400 Optical 90-degree hybrid circuit
410 Variable gain amplifier
420 Analog-to-digital conversion unit (ADC)
430 Digital signal processing circuit (DSP)
1000 Coherent optical receiving device
11 First optical signal
12 Second optical signal
21 Optical received signal
31 First local oscillation light
32 Second local oscillation light
5000 Related coherent optical receiving device
5001 Optical received signal
5002 Local oscillation light
5010 Polarization separation unit
5100 Optical 90-degree hybrid circuit
5200 Photodiode
5300 Differential transimpedance amplifier
5400 Analog-to-digital conversion unit (ADC)
5500 Digital signal processing unit (DSP)

What is claimed is:

1. An optical receiver, comprising:
a first photodiode receiving a first optical signal and outputting a positive signal;
a second photodiode receiving a second optical signal and outputting a complementary signal;
a differential transimpedance amplifier receiving the positive signal and outputting an amplified positive signal voltage, and receiving the complementary signal and outputting an amplified complementary signal voltage; and
a gain adjustment adjusting a first gain of a gain of the differential transimpedance amplifier for the positive signal and a second gain of a gain of the differential transimpedance amplifier for the complementary signal,
wherein the differential transimpedance amplifier comprises a differential amplifier,
the gain adjustment unit comprises a variable impedance unit connected to the differential amplifier, and
the variable impedance unit is configured for its impedance to vary corresponding to an adjustable range of the first gain and the second gain.

2. The optical receiver according to claim 1,
wherein the first optical signal is a first interference optical signal obtained by making an optical received signal interfere with first local oscillation light whose wavelength is almost the same as that of the optical received signal, and
the second optical signal is a second interference optical signal obtained by making the optical received signal interfere with second local oscillation light whose phase is reversed with respect to the first local oscillation light.

3. The optical receiver according to claim 2,
wherein the differential transimpedance amplifier comprises a differential amplifier,
the gain adjustment unit comprises a variable impedance unit connected to the differential amplifier, and
the variable impedance unit is configured for its impedance to vary corresponding to an adjustable range of the first gain and the second gain.

4. The optical receiver according to claim 1,
wherein the variable impedance unit has one end connected to a ground side of the differential amplifier and the other end connected to a control terminal, and
the impedance of the variable impedance unit varies depending on a voltage applied to the control terminal.

5. The optical receiver according to claim 4, further comprising a peak detection unit,
wherein the peak detection unit detects voltage amplitudes of the positive signal voltage and the complementary signal voltage respectively, and feeds back the voltage amplitudes to the gain adjustment unit.

6. The optical receiver according to claim 5, further comprising a level conversion unit,
wherein the level conversion unit converts a level of the voltage amplitude and applies converted voltage to the control terminal.

7. The optical receiver according to claim 6,
wherein the variable impedance unit comprises one of a diode element and a transistor element.

8. The optical receiver according to claim 5,
wherein the variable impedance unit comprises one of a diode element and a transistor element.

9. The optical receiver according to claim 4,
wherein the variable impedance unit comprises one of a diode element and a transistor element.

10. The optical receiver according to claim 1,
wherein the variable impedance unit comprises one of a diode element and a transistor element.

11. An optical receiving device, comprising:
an optical receiver; and
an optical 90-degree hybrid circuit,
wherein
the optical receiver comprises
- a first photodiode receiving a first optical signal and outputting a positive signal;
- a second photodiode receiving a second optical signal and outputting a complementary signal;
- a differential transimpedance amplifier receiving the positive signal and outputting an amplified positive signal voltage, and receiving the complementary signal and outputting an amplified complementary signal voltage; and
- a gain adjustment unit adjusting a first gain of a gain of the differential transimpedance amplifier for the positive signal and a second gain of a gain of the differential transimpedance amplifier for the complementary signal;
- wherein the first optical signal is a first interference optical signal obtained by making an optical received signal interfere with first local oscillation light whose wavelength is almost the same as that of the optical received signal, and
- the second optical signal is a second interference optical signal obtained by making the optical received signal interfere with second local oscillation light whose phase is reversed with respect to the first local oscillation light; and the optical 90-degree hybrid circuit makes the optical received signal interfere with the first local oscillation light and outputs the first interference optical signal, and makes the optical received signal interfere with the second local oscillation light and outputs the second interference optical signal,
wherein the differential transimpedance amplifier comprises a differential amplifier,
the gain adjustment unit comprises a variable impedance unit connected to the differential amplifier, and
the variable impedance unit is configured for its impedance to vary corresponding to an adjustable range of the first gain and the second gain.

12. The optical receiving device according to claim 11,
wherein the variable impedance unit has one end connected to a ground side of the differential amplifier and the other end connected to a control terminal, and
the impedance of the variable impedance unit varies depending on a voltage applied to the control terminal.

13. The optical receiving device according to claim 12, further comprising a peak detection unit,
wherein the peak detection unit detects voltage amplitudes of the positive signal voltage and the complementary signal voltage respectively, and feeds back the voltage amplitudes to the gain adjustment unit.

14. The optical receiving device according to claim 13, further comprising a level conversion unit,
wherein the level conversion unit converts a level of the voltage amplitude and applies converted voltage to the control terminal.

15. The optical receiving device according to claim 11,
wherein the variable impedance unit comprises one of a diode element and a transistor element.

16. A method for correcting received optical intensity, comprising:
receiving a first optical signal, converting the first optical signal into an electrical signal, and outputting a positive signal;
receiving a second optical signal, converting the second optical signal into an electrical signal, and outputting a complementary signal;
amplifying the positive signal and the complementary signal and outputting a positive signal voltage and a complementary signal voltage; and
adjusting a first gain for the positive signal voltage and a second gain for the complementary signal voltage respectively so that a voltage amplitude of the positive signal voltage may become almost equal to a voltage amplitude of the complementary signal voltage,
wherein adjustments for the first gain and the second gain is made by adjusting an impedance of an amplifier having a function of amplification.

* * * * *